United States Patent [19]
Hasegawa et al.

[11] Patent Number: 6,016,018
[45] Date of Patent: *Jan. 18, 2000

[54] ELECTRONIC APPARATUS INCORPORATING BATTERY

[75] Inventors: Kazuo Hasegawa; Daisuke Takai, both of Miyagi-ken, Japan

[73] Assignee: Alps Electric Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 08/975,954

[22] Filed: Nov. 21, 1997

[30] Foreign Application Priority Data

Nov. 22, 1996 [JP] Japan .................................. 8-327935

[51] Int. Cl.$^7$ .................................................. H02M 3/06
[52] U.S. Cl. ........................................... 307/109; 307/125
[58] Field of Search ................................ 327/551–555, 327/221, 344; 257/533; 333/172; 307/9.1–10.51, 109, 116, 125, 131; 340/310.01–310.07, 636; 320/106

[56] References Cited

U.S. PATENT DOCUMENTS

| | | | |
|---|---|---|---|
| 3,289,276 | 12/1966 | Wasyluk | 333/70 |
| 3,389,349 | 6/1968 | Troost et al. | 333/70 |
| 3,402,372 | 9/1968 | Wasyluk | 333/70 |
| 3,408,590 | 10/1968 | Moschytz | 330/85 |
| 3,603,898 | 9/1971 | Dawson | 333/70 |
| 3,939,423 | 2/1976 | Zakharov et al. | 325/312 |
| 3,983,504 | 9/1976 | Moy | 330/107 |
| 3,993,967 | 11/1976 | Saifi | 333/70 CR |
| 4,044,261 | 8/1977 | Wilson | 250/369 |
| 4,663,597 | 5/1987 | Benzinger et al. | 330/107 |
| 4,697,134 | 9/1987 | Burkum et al. | 320/134 |
| 5,285,177 | 2/1994 | Norose | 333/176 |
| 5,587,924 | 12/1996 | Rossi | 364/496 |
| 5,859,583 | 1/1999 | Mayumi et al. | 340/436 |

FOREIGN PATENT DOCUMENTS

53-42327   4/1978   Japan .

*Primary Examiner*—Jeffrey Gaffin
*Assistant Examiner*—Peter Zura
*Attorney, Agent, or Firm*—Brinks Hofer Gilson & Lione

[57] ABSTRACT

An battery-driven electronic apparatus incorporating battery has a source battery, a driven circuit driven by the battery, a pair of external terminals connected to the both ends of the source battery and a capacitor provided between the source battery and the external terminals. A circuit for identifying voltage of a battery having a pair of checking terminals, a resistor, a transistor, a peak hold circuit, a multiplexor, a temperature measuring circuit, an A/D converter and an identification control circuit including an arithmetic circuit and an identification circuit is employed to identify voltage of the source battery of the electronic apparatus incorporating battery by coupling the pair of the checking terminals with the pair of the external terminals of the electronic apparatus incorporating battery, measuring voltages of the source battery repeatedly and calculating voltage differences by the arithmetic circuit for identifying whether the battery is usable or not by comparing voltage differences with predetermined values in the identification circuit without removing the source battery with minimal power consumption.

4 Claims, 6 Drawing Sheets

PRIOR ART

ELECTRONIC APPARATUS INCORPORATING BATTERY

BACKGROUND OF THE INVENTION

1. Field of the Invention

The present invention relates to an electronic apparatus incorporating battery such as a handy terminal, key-less entry device, ID tag and remote control device driven by battery.

2. Description of the Related Art

Now a conventional battery-driven electronic apparatus incorporating battery is described as follows. The FIG. 4 is a wiring diagram illustrating a conventional electronic apparatus incorporating battery driven by battery.

Referring to FIG. 4, an battery-driven electronic apparatus incorporating battery is comprised, for example, of a driven circuit 1 consisting of a receiver circuit 1a and a transmitter circuit 1b, a source battery 2 (for example, a 3V lithium battery), a capacitor 3 provided in parallel with the source battery 2, detecting terminals 4a and 4b, a resistor 6' (for example, of 200 ohm) disposed between an end of the source battery 2 and an end of the detecting terminals 4a and 4b.

The detecting terminals 4a and 4b are provided to enable to identify the voltage of the source battery 2 from outside without removing the source battery 2 from the electronic apparatus incorporating battery.

In the electronic apparatus incorporating battery with the above mentioned construction, an electric current in the order of several $\mu A$ is supplied to the drive circuit 100 by the voltage of the source battery 2 during stand-by mode but when it is turned into a predetermined operational mode, the drive circuit 100 drives the driven circuit 1 such as the receiver circuit 1a or the transmitter circuit 1b to turn it into an operation mode by supplying current in the order of several tens of mA from the source battery 2 to the driven circuit 1 to perform the predetermined operation.

By the way, the internal resistance of the source battery (for example, an alkaline battery or a lithium battery) generally increases as the voltage drops when the battery is exhausted. As the internal resistance increases, the value of the voltage to be measured will be varied due to the current of the source battery used in a circuit for measuring, so that if measurement is conducted with a minimal current without measuring the voltage by supplying the same amount of current as supplied in the operation mode, there has been a problem that it is impossible to confirm whether the apparatus will work without fail or not, when the apparatus is required to conduct a predetermined operation. Accordingly, in the prior art, the following identification circuit for the battery voltage has been utilized for measuring the battery voltage.

FIG. 5 is a drawing illustrating a conventional circuit for identifying battery voltage, which is comprised of, in the drawing, checking terminals 10a and 10b disposed so as to be connected to the detecting terminals 4a and 4b of the electronic apparatus incorporating battery, a resistor R1 for generating voltage drop by causing a current similar to one in the operation mode (for example, an average current to be consumed in the driven circuit 1) to flow in the source battery 2 of the electronic apparatus incorporating battery, an A/D converter 14 for converting an analog voltage value measured by the resistor R1 to digital signals and an identification circuit 15' for identifying the life of the source battery 2 by the digital signals from the A/D converter 14.

The conventional circuit for identifying battery voltage with above mentioned construction operates to cause a current of several tens of mA, or approximately the same value as that of the operation mode to flow through the resistor RI from the source battery 2 of the electronic apparatus incorporating battery by connecting the checking terminals 10a and 10b to the detecting terminals 4a and 4b of the electronic apparatus incorporating battery. It is adapted to provide the voltage generated in the resistor R1 into the identification circuit 15' via A/D converter 14 to display the result of identification of measured life of the source battery 2 by means of a display device not shown in the drawing.

However, in the above described prior art example, there was a problem that as the same extent of current as used in the operation mode is applied for voltage measurement, it is possible to measure correct voltage but the measurement would consume the battery. Further, also, if the detecting terminals 14 are short-circuited intentionally or accidentally, there occurs such problem as the voltage of the battery 2 will drop in a short while to cause the battery life to be shortened.

Especially in the case of an electronic apparatus incorporating battery which is not activated by the instruction given by an operator, such as an ID tag which turns its mode into the operation mode by receiving electromagnetic waves to conduct a predetermined operation, it is a big problem that it does not get into the predetermined operation.

SUMMARY OF THE INVENTION

It is an object of the present invention to provide an electronic apparatus incorporating battery, which is capable of measuring the voltage of the source battery incorporated in it correctly without excessively consuming the power of the source battery of the electronic apparatus incorporating battery to be measured.

It is another object of the present invention to provide an electronic apparatus incorporating battery, which is capable of preventing the voltage of the source battery from falling in a short while, even if the detecting terminals are short-circuited intentionally or accidentally, thus eliminating such problem as shortening of battery life.

It is further object of the present invention to provide an electronic apparatus incorporating battery, which is capable of allowing measurement of the voltage of the source battery in such an electronic apparatus incorporating battery as is not activated by the instruction given by an operator, such as an ID tag which turns its mode into the operation mode by receiving electromagnetic waves to conduct a predetermined operation.

Another object of the present invention is to provide an electronic apparatus incorporating battery, which is capable allowing easy measurement of the voltage of the source battery at desired time at will without being subjected by the limitation of the location of the electronic apparatus incorporating battery to be measured.

In order to accomplish the above object, the electronic apparatus incorporating battery of the present invention is comprised of a source battery, a driven circuit driven by the source battery, external terminals connected to the both ends of the source battery and a capacitor provided between the source battery and the external terminals.

The electronic apparatus incorporating battery of the invention is characterized in that a resistor is connected in parallel with a capacitor.

The electronic apparatus incorporating battery of the invention is characterized in that a diode is provided between a capacitor provided in a driven circuit and the source battery.

The electronic apparatus incorporating battery of the invention is characterized in that the diode is a Schottky barrier diode.

DESCRIPTION OF THE PREFERRED EMBODIMENT

Figure 1:
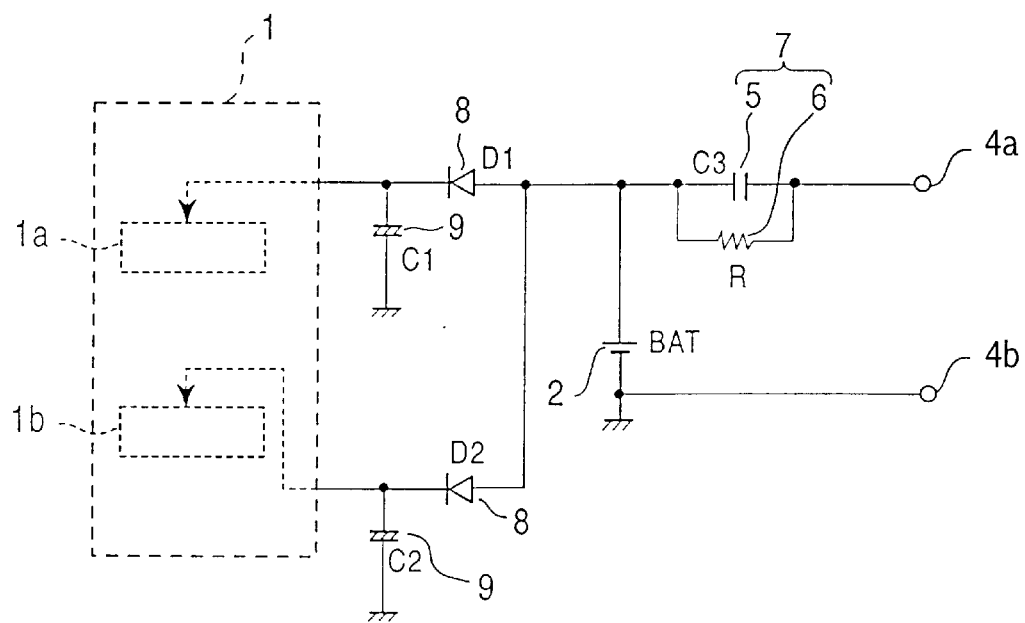
FIG. 1 is a wiring diagram illustrating the electronic apparatus incorporating battery of the invention.

Now referring to the drawings, an embodiment of the invention will be described in more detail. FIG. 1 is a circuit diagram generally illustrating a battery-driven electronic apparatus incorporating battery in accordance with an embodiment of the invention. Like reference numerals are utilized to denote the like elements depicted in the aforementioned prior art example.

The battery-driven electronic apparatus incorporating battery of the invention is, for example, such an apparatus as a handy terminal, key-less entry device, ID tag or remote control device and it is comprised, for example, of a driven circuit 1 equipped with a receiver circuit 1a and a transmitter circuit 1b, a source battery 2 (for example, a 3V lithium battery), and detecting terminals 4a and 4b. It is also provided with a parallel circuit 7 having a capacitor 5 (for example, of 0.1 μF) connected in parallel with a resistor 6 (for example, of 200 ohm) between the detecting terminals 4a and 4b and the source battery 2. Also, diodes 8 such as Schottky barrier diodes with small forward voltage drop are disposed between the driven circuit 1 and the source battery 2 with one (D1) of the diodes 8 being connected to the receiver circuit 1a and another one (D2) of the diodes 8 to the transmitter circuit 1b.

Also, capacitors 9 are connected in parallel between the diodes 8 and the driven circuit 1. The capacitors 9 are for reducing apparent impedance on the side of the source battery 2, while it works to eliminate ripples and to supply current, as against the driven circuit 1. The diodes 8 prevent the current from flowing from the capacitors 9 to the source battery 2 to allow correct measurement in measuring the voltage of the source battery 2.

The detecting terminals 4a and 4b are for detecting the voltage of the source battery 2 from outside of the electronic apparatus incorporating battery and are provided for easy identification of the voltage of the source battery 2. The detecting terminals 4a and 4b makes it possible to identify the voltage of the source battery 2 at will when desired.

Also, even if the detecting terminals 14 are short-circuited, for example, intentionally or accidentally, the parallel circuit 7 having a capacitor 5 and a resistor 6 prevents the voltage of the source battery 2 from dropping in a short while, reaching the end of its life (by exhaustion), thus enable to avoid such condition as the driven circuit 1 failing to be driven normally. This serves to ensure long hours of normal and stable operation of the electronic apparatus incorporating battery.

Next, the circuit for identifying the voltage of a battery in accordance with the embodiment of the invention will be described in detail by referring to the drawings.

Figure 2:
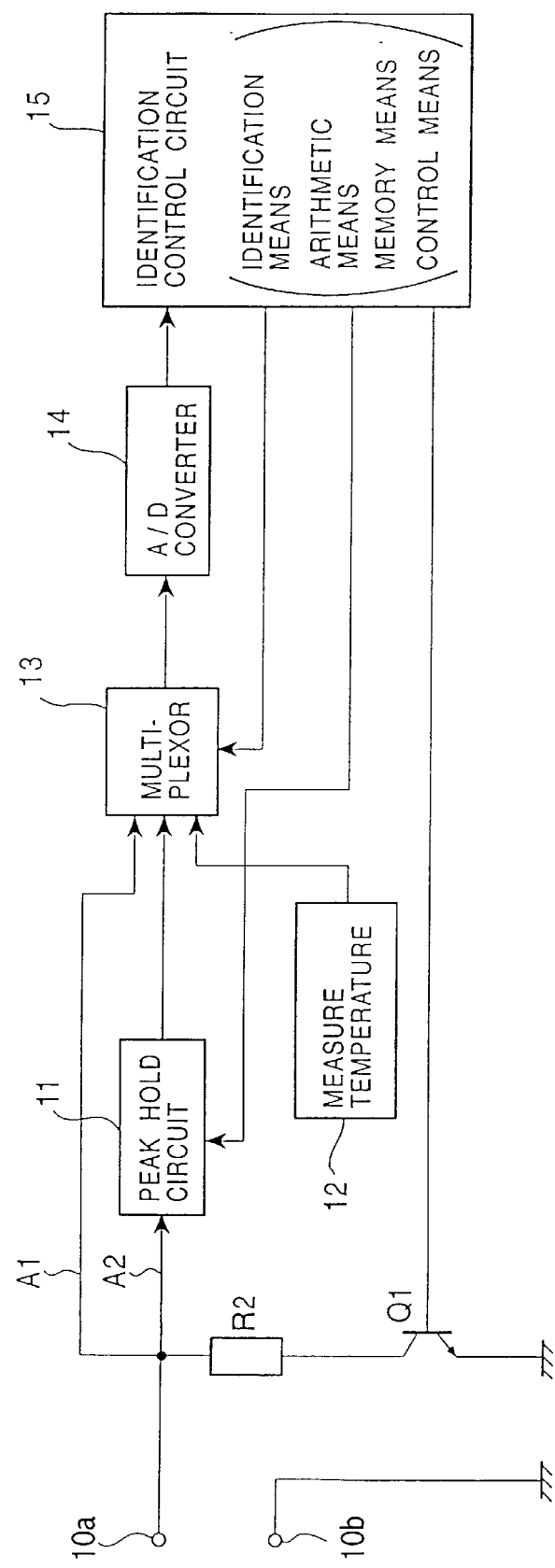
FIG. 2 is a drawing illustrating the circuit for identifying the battery voltage of the invention.

FIG. 2 is a drawing generally illustrating the circuit for identifying the voltage of the source battery in accordance with the embodiment of the invention. Like reference numerals are utilized to denote the like elements depicted in the above mentioned prior art example.

The circuit for identifying the voltage of the battery in accordance with the embodiment of the invention comprises checking terminals 10a and 10b for identifying the voltage of the source battery 2 by being connected to the detecting terminals 4a and 4b of the electronic apparatus incorporating battery, a resistor R2 for flowing predetermined current through the source battery 2 connected to the checking terminals 10a and 10b, a peak hold circuit 11 for holding the peak value of the voltage generated by the resistor R2, a transistor Q1 as a switching element (means), a temperature measuring circuit 12 consisting of a thermistor, etc., a multiplexor 13 for switching and controlling the temperature output (in analog voltage value) of the temperature measuring circuit 12 or no-load voltage of the peak hold circuit 11 or the checking terminals 10a and 10b, an A/D converter 14 for converting analog signals from the multiplexor 13 to digital signals, and a identification control circuit 15 including an identifying means for identifying signals from the A/D converter 14, an arithmetic means for calculating differences between voltage values, a memory means for storing calculated voltage differences, a control means for controlling the multiplexor 13, the peak hold circuit 11, the temperature measuring circuit 12 and the transistor Q1 (a switching means).

Figure 3:
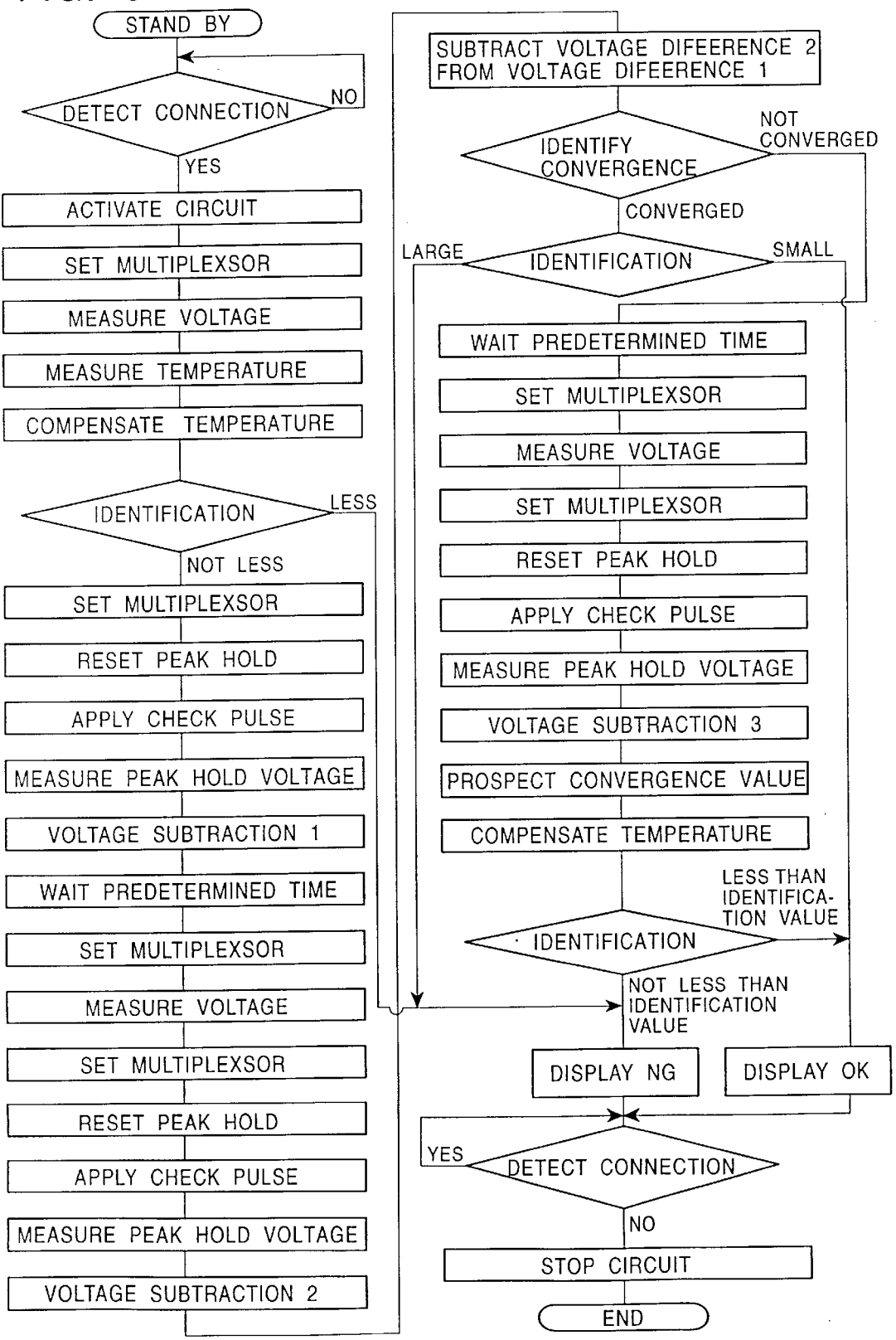
FIG. 3 is a flow chart illustrating the operation of the circuit for identifying the battery voltage of the invention.
Figure 4:
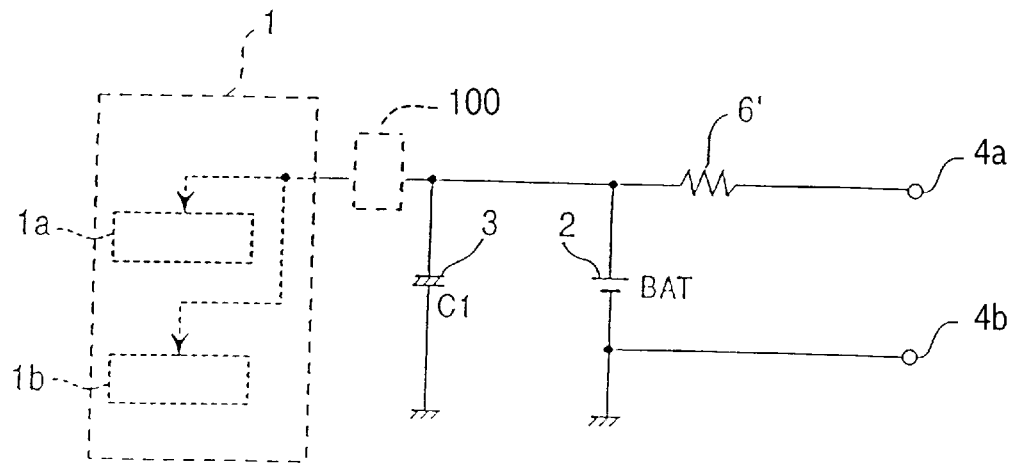
FIG. 4 is a wiring diagram illustrating a conventional electronic apparatus incorporating battery.
Figure 5:
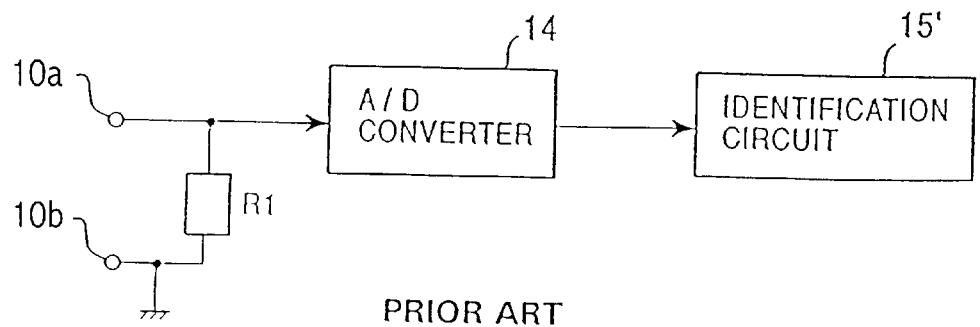
FIG. 5 is a drawing illustrating a conventional circuit for identifying the battery voltage.
Figure 6:
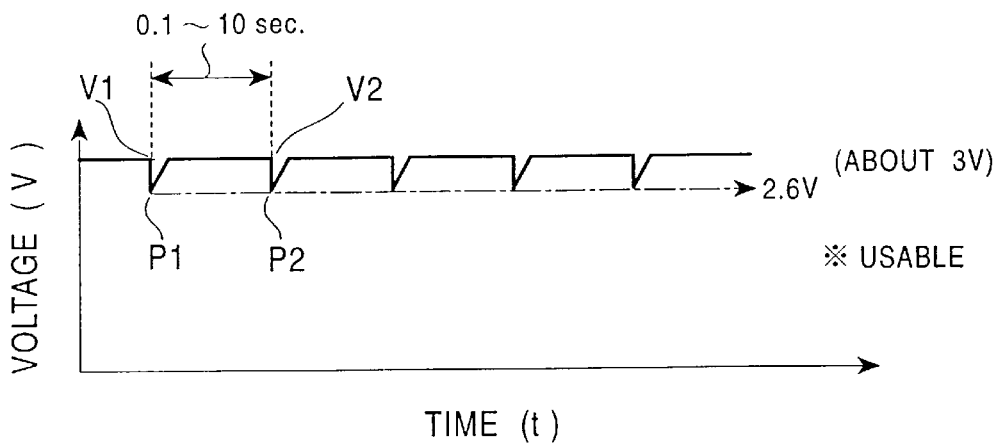
FIG. 6 is a drawing illustrating the result of a measurement of voltage of a new battery (in working order).
Figure 7:
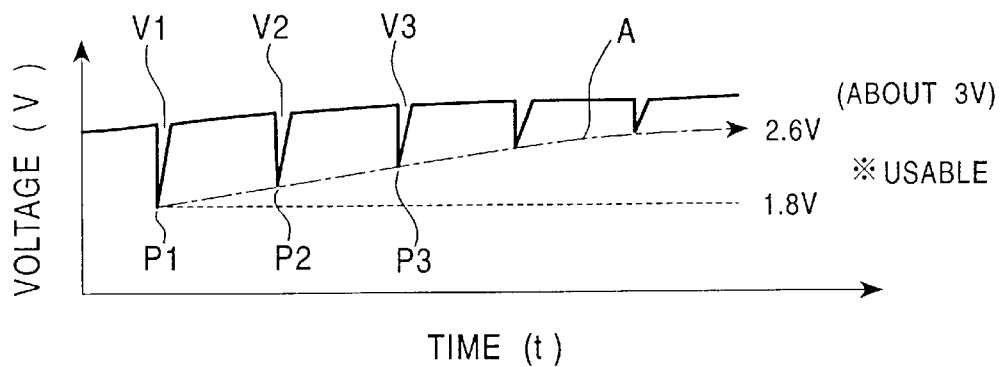
FIG. 7 is a drawing illustrating the result of a measurement of voltage of a new battery just after operation.
Figure 8:
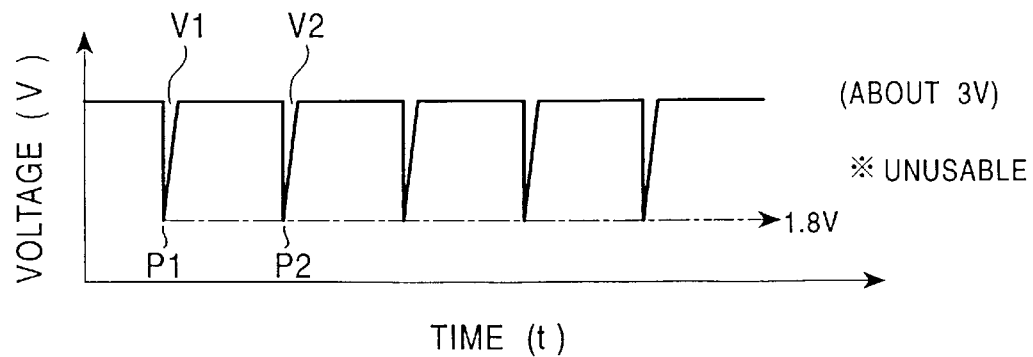
FIG. 8 is a drawing illustrating the result of a measurement of voltage of an exhausted (not in working order) battery.
Figure 9:
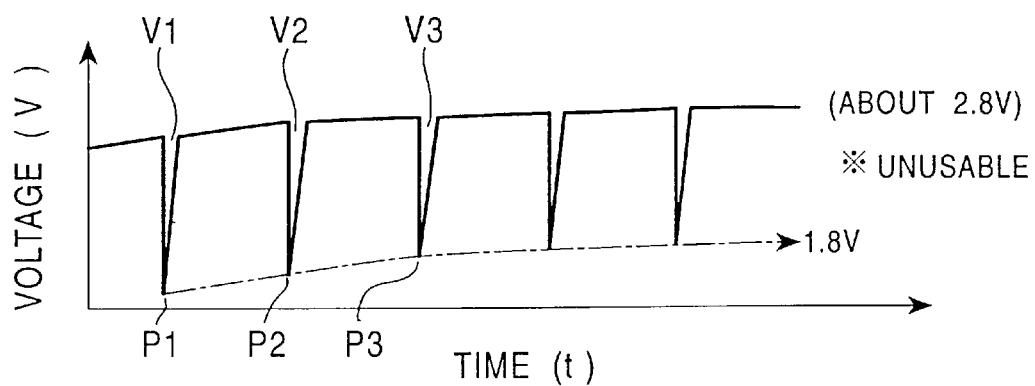
FIG. 9 is a drawing illustrating the result of a measurement of voltage of an exhausted battery just after operation.

Next, referring to the flow chart of FIG. 3, described is how to identify voltage by means of the circuit for identifying the voltage of the battery of aforementioned FIG. 2. In this instance the inventors found through various experiments that it was necessary, as shown in FIGS. 6 to 10, to identify the extent of battery exhaustion by measuring voltage for a predetermined length of time as the battery showed varying voltage just after it was used, while it was also required to be identified by varying current values flowing through the battery. The identification method of this instance was conducted by taking advantage of this property.

Referring to FIGS. 2 and 3, first the detecting terminals 4a and 4b of the electronic apparatus incorporating battery are connected to the checking terminals 10a and 10b of the circuit for identifying the voltage of the battery. Upon detection of this connection by a detecting switch not shown, each of circuits composing the circuit for identifying the voltage of the battery is activated.

Next, the multiplexor 13 is switched to the line A1 which is connected to the side of the checking terminals 10a and 10b by a signal from the identification control circuit 15 composing of a control means. At this time, the transistor Q1 as a switching means is put in an open state by the control means of the identification control circuit 15 so as to prevent a current from flowing through the resistor R2.

Then, the no-load battery voltage V1 (for example, 3V with a lithium battery) from the checking terminals 10a and 10b is detected, which is converted in the A/D converter 14 to generate a voltage value which is in turn fed into the identification control circuit 15 to be stored in a memory means which is not shown. By the way, there is almost no power consumption of the source battery 2, as the aforementioned A/D converter 14 has a very large impedance.

Then, the multiplexor 13 is switched to the temperature measuring circuit 12 which is a temperature measuring means.

And next, the atmospheric temperature measured by the temperature measuring circuit 12 is converted from analog to digital values to be stored in the memory means which is not shown.

This measurement by the temperature measuring circuit 12 is for conversion of the measured battery voltage under the actual temperature into that under the predetermined conditions (usually under the normal temperature), as a battery voltage varies depending on temperature.

Figure 10:
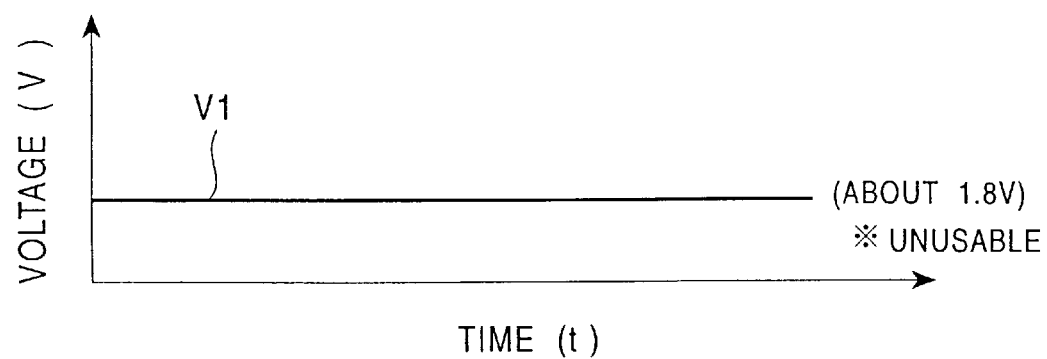
FIG. 10 is a drawing illustrating the result of a measurement of voltage of a more exhausted (run out of life) battery.

Next, if the measured voltage V1 is 1.8V as shown in FIG. 10, which is less than the predetermined value (for example, 2.4V with a lithium battery), it is identified as showing that the battery has run out of its life or it is not mounted (0V) in the electronic apparatus incorporating battery and procedure is jumped to go to the step of displaying NG. This will serve to cut short the voltage identification procedures.

Next, the multiplexor 13 is switched to the peak hold circuit 11 to move to the measurement of a battery in which the voltage value V1 is equal to or more than predetermined value.

First, the peak hold circuit 11 is reset to be ready for measuring voltage in line A2.

Next, pulses for checking the battery voltage is applied for a short period to the transistor Q1 as a switching means by control signals from the identification control circuit 15 to turn the transistor Q1 ON for flowing predetermined current through the resistor R2 and the voltage generated by the resistor R2 is measured at the peak hold circuit 11 to convert the peak hold value P1 from analog to digital at the A/D converter 14 for storing in the memory means. At this point, most of the current flows to the resistor R2 through the capacitor 5 (the resistor 6(R) is sufficiently larger than the resistor R2) to be charged in the capacitor 5 but when it is discharged through the resistor R2, the voltage of the current returns to the no-load voltage. (refer to FIGS. 6–8)

Then, the voltage generated by the resistor R2 is measured at the peak hold circuit 11 to convert the peak hold value P1 from analog to digital at the A/D converter 14 for storing in the memory means.

Next, the peak hold value (Voltage) P1 (for example, 2.5V) is subtracted from the voltage V1 (for example, 3V) of line A1 from the checking terminals 10 by the first arithmetic means provided in the identification control circuit 15 to obtain a voltage difference 1 (V1−P1=0.5V) for storing in the memory means of the identification control circuit 15.

Next, it is necessary to wait for a predetermined length of time (for example, 0.1–10 seconds). The waiting time is established so as to be some 5 times longer than the time constant (for example, 0.1 seconds) of the parallel circuit 7 consisting of the capacitor 5 (for example, 0.1 μF) and the resistor 6 (for example, 200 Kohm). This is for obtaining a result without an error by measuring the voltage again after discharging the charge of the capacitor 5 once. Also, by waiting for the predetermined time length a battery shows self-recovering characteristic (refer to FIGS. 7 and 9) in which a battery just after operation (for example, a battery just after driving the receiver or the transmitter) shows a tendency to recover (increase) the voltage value.

By the way, the time period shorter than 0.1 seconds will not give sufficient time for the battery to fully realize the self-recovering characteristic and a longer than 10 seconds time length takes too much time for a measurement.

Next, the multiplexor 13 is switched to the side of line A1 of the checking terminals 10a and 10b by a control signal from the identification control circuit 15.

Then, the no-load battery voltage V2 (for example, 3V) from the checking terminals 10a and 10b is measured and is converted in the A/D converter 14 to generate a voltage value which is in turn fed into the identification control circuit 15 to be stored in a memory means.

Next, the multiplexor 13 is switched to the peak hold circuit 11 as described before.

Next, the peak hold circuit 11 is reset to prepare for measuring voltage in line A2 as described before.

Next, pulses for checking the battery is applied for a short period to the transistor Q1 as described before.

Then, the peak hold value P2 (for example, 2.6V: the voltage is increased due to the self-recovering characteristic) measured in the above step is converted from analog to digital for storing in the memory means.

Next, the peak hold value P2 (for example, 2.6V) is subtracted from the no-load voltage V2 (for example, 3V) from the checking terminals 10a and 10b in the first arithmetic means to obtain a voltage difference 2 (V2−P2=0.4V) for storing in the memory means.

Next, the voltage difference 2 (for example, 0.4V) in the previous step is subtracted from the aforementioned voltage difference 1 (for example, 0.5V) at the second arithmetic means provided in the identification control circuit 15. If the voltage difference (for example, the voltage difference 1–the voltage difference 2=0.1V) is less (including a minus value) than a predetermined value (for example, less than 0.02V), the voltage value is deemed to be converged and in case the value of the voltage difference 2 is more than a predetermined value (for example, 0.5V at 20 degree C.), the identification means provided in the identification control circuit 15 identifies that the battery is exhausted and the procedure is jumped to display NG. Accordingly, the battery shown in FIG. 8 with a voltage difference of 1V is displayed as NG. Also, the battery shown in FIG. 6 with a voltage difference 2 of 0.4V which is less than the predetermined value is displayed as OK. Further, if the voltage difference is more than the predetermined value (for example, not less than 0.02V), the voltage value is deemed not to have been converged and the procedures proceed to the next step.

Next, it is necessary to wait for a predetermined length of time (for example, 0.1–10 seconds).

Next, the multiplexor 13 is switched to the side of line A1 of the checking terminals 10a and 10b as mentioned before.

Then, the no-load battery voltage V3 from the checking terminals 10a and 10b is measured and is converted in the A/D converter 14 to generate a voltage value which is in turn fed into the identification control circuit 15 to be stored in the memory means.

Next, the multiplexor 13 is switched to the peak hold circuit 11 by control signals from the identification control circuit 15.

Next, the peak hold circuit 11 is reset to prepare for measuring again.

Next, pulses for checking the battery voltage is applied to the transistor Q1.

Next, the peak hold value detected in the peak hold circuit 11 is converted from analog to digital to be stored in the memory means.

Next, the peak hold value (voltage)P3 (for example, 2.65V) is subtracted from the voltage V3 (for example, 3V) from the checking terminals 10 to obtain a voltage difference 3 (V3−P3=0.35V) to be stored in the memory means of the identification control circuit 15.

Next, prospect of the convergence value (for example 0.25V) of the voltage difference is conducted utilizing three voltage differences 1, 2 and 3 (for example 0.5, 0.4 and 0.35V) stored in the memory means. This is for identifying the battery life by comparing a predicted curve which is obtained by connecting points representing three voltage differences with an identification table (for example, the curve expressed by a broken line A in FIG. 7) stored in the identification control circuit 15 in advance.

Next, an identification value corresponding with the temperature measured in the temperature measuring circuit 12 is loaded from the identification control circuit 15.

Next, comparison is made between the identification value and the convergence value of the voltage differences. This is for identification of the battery life by comparing a predicted curve depicted by three voltage differences with an identification value stored in the identification control circuit 15 in advance. In this step, if the predicted convergence value of the voltage of the predicted curve is less than 0.5V, the battery is identified not to have been exhausted still (OK). Accordingly, the battery in FIG. 7 with 0.4V convergence value is identified to be OK. Also, if not less than 0.5 V, the battery is identified to have been exhausted (NG). Accordingly, the battery in FIG. 9 with 1V convergence value is identified to be NG.

Next, the result (OK or NG) of the above identification is displayed. This displaying is done by, for example, a buzzer or LED which are not shown.

Next, the detecting terminals 4a and 4b of the electronic apparatus incorporating battery are disconnected (separated) from the checking terminals 10a and 10b of the circuit for identifying the battery voltage. Upon detection of this disconnection by the detecting switch not shown, operation of each of circuits consisting the circuit for identifying the battery voltage comes to an end. After the end of operation, the circuit for identifying the battery voltage is put into a stand-by mode.

The battery life of the electronic apparatus incorporating battery is thus identified according to the aforementioned procedures.

If either one of the electronic apparatus incorporating battery or the circuit for identifying the battery voltage is constructed in a portable (being able to carry around) configuration, this connection can be carried out in any place without being subjected by the limitation of location where the connection takes place, enhancing efficiency of the battery voltage identification procedures.

Also, the power source of the circuit for identifying the battery voltage is supplied from a source battery or a AC power source which are not shown.

According to the electronic apparatus incorporating battery of the invention, the series-connected capacitor provided between the source battery and the external terminals prevents any current from flowing after completion of the charging of the capacitor, so that it enables to prevent battery exhaustion in a short while, even if the external terminals are short-circuited accidentally or intentionally.

Also, according to the electronic apparatus incorporating battery of the invention, a resistor connected to a capacitor in parallel allows to discharge electric charge in the capacitor through it, so that it is possible to measure voltage correctly in the next cycle of the voltage measurement.

Also, according to the electronic apparatus incorporating battery of the invention, a diode is provided between a capacitor provided in the driven circuit and the source battery. The diode prevents a current from flowing from the capacitor to the battery, so that it is possible to measure voltage correctly.

Also, further, according to the electronic apparatus incorporating battery of the invention, the diode is a Schottky barrier diode with small forward voltage drop, so that it is possible to make a loss by diode minimal.

Many different embodiments of the present invention may be constructed without departing the spirit and scope of the invention. It should be understood that the present invention is not limited to the specific embodiments described in this specification. To the contrary, the present invention is intended to cover various modifications and equivalent arrangements included within the spirit and scope of the claims.

What is claimed is:

1. An electronic apparatus incorporating battery comprising:

a source battery for generating a DC voltage, said source battery having a positive terminal and a negative terminal;

a driven circuit connected to one of said terminals of said source battery such that said driven circuit is driven by said source battery;

two external terminals, one of the external terminals connected to the positive terminal of said source battery, the other of the external terminals connected to the negative terminal of said source battery;

a capacitor connected in series between one of the positive terminal and the negative terminal of said source battery and one of said external terminals, a battery voltage identification circuit having a detection circuit to detect a current of said capacitor; and wherein said two external terminals are connected and disconnected by said battery voltage identification circuit.

2. The electronic apparatus incorporating battery of claim 1, wherein a resistor is connected in parallel to said capacitor.

3. The electronic apparatus incorporating battery of claim 1, wherein a diode is connected between a second capacitor in said driven circuit and said source battery.

4. The electronic apparatus incorporating battery of claim 3, wherein said diode is a Schottky barrier diode.

* * * * *